United States Patent [19]
Spinner et al.

[11] Patent Number: 5,146,309
[45] Date of Patent: Sep. 8, 1992

[54] METHOD FOR FORMING POLYCRYSTALLINE SILICON CONTACTS

[75] Inventors: Charles R. Spinner; Fusen E. Chen, both of Dallas; Fu-Tai Liou, Carrollton, all of Tex.

[73] Assignee: SGS-Thomson Microelectronics, Inc., Carrollton, Tex.

[21] Appl. No.: 705,775

[22] Filed: May 28, 1991

Related U.S. Application Data

[62] Division of Ser. No. 370,615, Jun. 23, 1989, Pat. No. 5,059,554.

[51] Int. Cl.[5] .................. H01L 27/11; H01L 23/532
[52] U.S. Cl. ..................................... 357/59; 357/41; 357/67; 357/71
[58] Field of Search ................ 357/59 I, 59 J, 59 K, 357/71, 41, 67

[56] References Cited

U.S. PATENT DOCUMENTS

| | | | |
|---|---|---|---|
| 4,569,122 | 2/1986 | Chan | 357/59 I |
| 4,901,134 | 2/1990 | Misawa et al. | 357/59 I |
| 4,903,096 | 2/1990 | Masuoka et al. | 357/59 J |

*Primary Examiner*—William D. Larkins
*Attorney, Agent, or Firm*—Kenneth C. Hill; Lisa K. Jorgenson; Richard K. Robinson

[57] ABSTRACT

A method for fabricating integrated circuits is used to improve contacts between polycrystalline interconnect and underlying polycrystalline or monocrystalline silicon regions. After contact openings are formed, a layer of titanium is deposited over the integrated circuit. The titanium is reacted in nitrogen to form a silicide layer only in the openings. Titanium nitride and unreacted titanium are then removed, and a layer of polycrystalline silicon deposited and patterned. The silicide layer between the polycrystalline interconnect and the underlying silicon ensures that a high quality contact is formed.

7 Claims, 2 Drawing Sheets

METHOD FOR FORMING POLYCRYSTALLINE SILICON CONTACTS

This is a division of application Ser. No. 07/370,615, filed Jun. 23, 1989, now U.S. Pat. No. 5,059,554.

BACKGROUND OF THE INVENTION

1. Field of the Invention

The present invention relates generally to semiconductor integrated circuits, and more specifically to a method for forming polycrystalline silicon contacts in semiconductor circuits.

2. Description of the Prior Art

In semiconductor integrated circuit processing, electrical connections are made between various levels of interconnect and between electrical interconnect levels and a monocrystalline substrate. Electrical quality of these contacts is important to the quality and reliability of integrated circuits fabricated using them.

Damage to the monocrystalline silicon lattice in the contact area can degrade the quality of the contact. Such damage is often seen after reactive ion etching and ion implant processing steps. This damage is caused by the high energy particle bombardment of the surface, and is manifested as crystalline lattice defects and surface irregularities.

Defects at the silicon surface cause oxidation problems when a layer of polycrystalline silicon is deposited over the contact opening. The silicon dioxide insulator formed at the contacts results in a poor electrical connection with high resistance. Electrical quality of the contacts often varies from lot to lot, and even varies between individual chips within a single semiconductor wafer.

The quality of electrical contacts can vary from lot to lot depending on the amount of etching or ion implant performed. For example, a slight over etch used to fully clear oxide from a contact opening can greatly increase the damage to the underlying silicon layer. This in turn greatly decreases contact quality, because the amount of later oxidation seen at the surface depends on the extent of damage caused by high energy ions. Unavoidable process variations in the amount of etching or ion implantation performed during integrated circuit fabrication, and in corresponding variances in the amount of oxide formed at the interface, means that the actual contact resistance is not well controlled.

In many process flows, annealing step is performed prior to the deposition of the polycrystalline silicon interconnect layer. This annealing step reduces the surface defects somewhat, improving the oxidation problem in the contact. However, the contact quality is still not as good as often desired. In addition, contact quality still varies depending upon variance in process parameters.

It would therefore be desirable to provide a method for semiconductor integrated circuit processing which provides improved polysilicon to silicon contacts.

SUMMARY OF THE INVENTION

It is therefore an object of the present invention to provide a method for processing semiconductor integrated circuits which provides improved polycrystalline silicon to silicon contacts.

It is further object of the present invention to provide such a method which provides improved contacts to both a substrate and to lower polycrystalline silicon layers.

It is another object of the present invention to provide such a method which does not greatly complicate existing integrated circuit process flows.

Therefore, in accordance with the present invention, a method for fabricating integrated circuits is used to improve contacts between polycrystalline interconnect and underlying polycrystalline or monocrystalline silicon regions. After contact openings are formed, a layer of titanium is deposited over the integrated circuit. The titanium is reacted in nitrogen to form a silicide layer only in the openings. Titanium nitride and unreacted titanium are then removed, and a layer of polycrystalline silicon deposited and patterned. The silicide layer between the polycrystalline interconnect and the underlying silicon ensures that a high quality contact is formed.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjuction with the accompanying drawings, wherein:

DESCRIPTION OF THE PREFERRED EMBODIMENT

The process steps and structures described below do not form a complete process flow for manufacturing integrated circuits. The present invention can be practiced in conjuction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
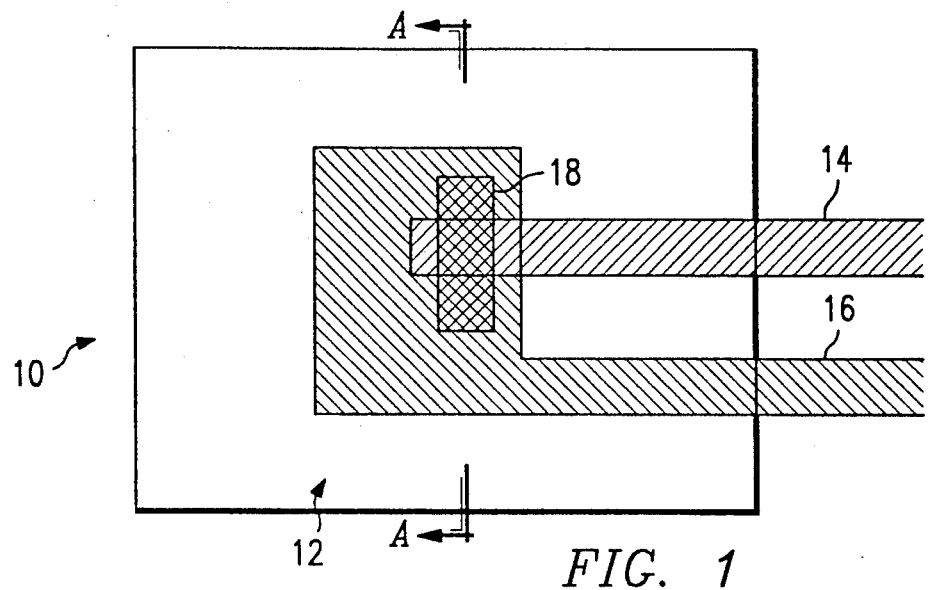
FIG. 1 is a plan view of a shared contact on an integrated circuit.

FIG. 1 illustrates a shared contact region 10 of an integrated circuit device. The shared contact 10 occurs over an active area 12 on an integrated circuit. The active area 12 consists of a region in a monocrystalline silicon substrate which has P-type or N-type impurities diffused thereinto. A conductive lead patterned from a first level of polycrystalline silicon 14 lies over a portion of the active area 12, and is separated therefrom by an insulating oxide layer (not shown). First level polycrystalline structures are often referred to as first level poly or poly-1. A conductive lead formed from a second level of polycrystalline silicon 16, often referred to as second level poly or poly-2, overlies a portion of the active area 12 and part of the first level poly lead 14. The second level poly 16 is separated from the first level poly 14 and the active region 12 by an insulating oxide layer (not shown).

A shared contact region 18 provides a common electrical contact region between the active area 12, the first level poly 14, and the second level poly 16. As will be described below, the second level poly 16 covers the shared contact region 18.

The shared contact described in FIG. 1 has uses in various types of integrated circuits. It is suitable for use in, for example, a portion of a static random access memory (SRAM). First level poly lead 14 overlies an active region not shown in FIG. 1 to form the gate of a field effect transistor. The second level poly lead 16 is typically used as a resistive load in the SRAM cell. The active area 12 is a source/drain region for two or more field effect transistors (not shown).

FIGS. 2-5 illustrate a sequence of process steps which can be used to fabricate the shared contact 10 shown in FIG. 1. FIGS. 2-5 illustrate a sequence of cross-sections taken through FIG. 1 at the line mark A—A, although they are not drawn to scale with FIG. 1.

Figure 2:
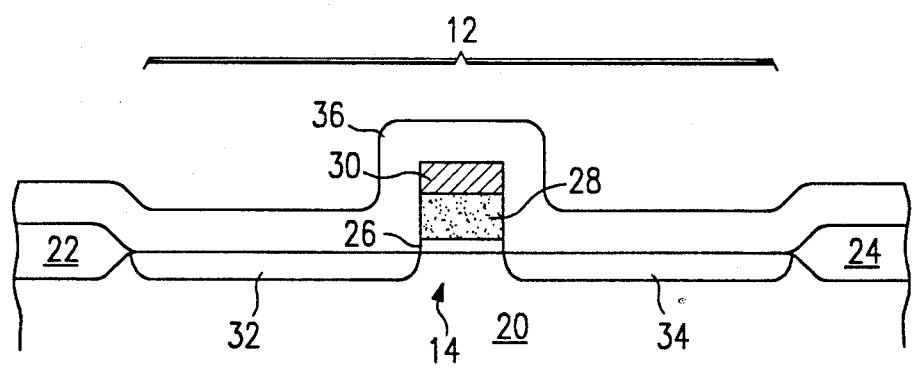
FIGS. 2–5 illustrate a preferred process flow to form a shared contact utilizing the teachings of the present invention, wherein the intermediate structures shown are viewed along the line A—A of FIG. 1.

Referring to FIG. 2, the active region 12 is formed in a monocrystalline silicon substrate 20. The active region 12 is surrounded by field oxide regions 22, 24 which are used to isolate various parts of the integrated circuit. Successive layers of a gate oxide 26, first level polysilicon 28, and tantalum disilicide (TaSi$_2$) layer 30 have been formed and patterned as known in the art to form the first level poly lead 14. Lightly doped drain (LDD) implants 32, 34 are made as known in the art to form LDD structures. The entire surface of the integrated circuit is then covered with a conformal layer of silicon dioxide 36 using a chemical vapor deposition (CVD) or low pressure chemical vapor deposition (LPCVD) technique.

Figure 3:
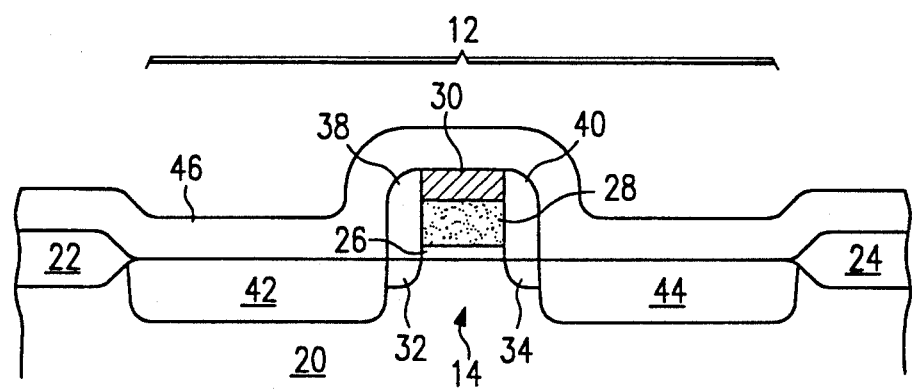

Referring to FIG. 3, the oxide layer 36 is anisotropically etched to form sidewall spacer regions 38, 40. Heavily doped source/drain regions 42, 44 are then formed by ion implantation, and annealed. An insulating interlevel oxide layer 46 is then formed over the integrated circuit using CVD or LPCVD.

When FIG. 1 is considered in combination with FIG. 3, is will be seen that the LDD regions 32, 34 are actually part of a single region connected at a point not shown in FIG. 3. The same is true for the source/drain regions 42, 44. Thus, although the structure shown in FIGS. 3-5 looks like a cross-section of a field effect transistor, it does not operate as a field effect transistor. Elsewhere on the integrated circuit, actual field effect transistors are being fabricated using the same process steps which form the structure shown in FIG. 3.

Figure 4:
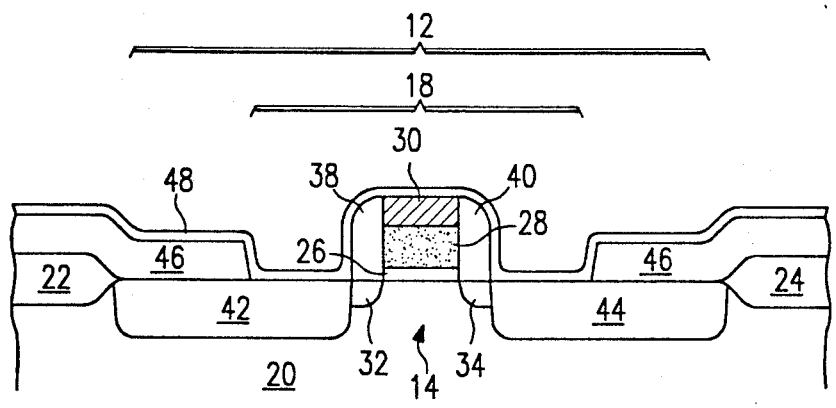

Referring to FIG. 4, the interlevel oxide 46 is patterned and etched to form an opening for the shared contact region 18. A thin layer of titanium 48 is sputtered onto the surface of the integrated circuit, preferably having a thickness of approximately 300-500 angstroms.

The titanium layer 48 is then reacted in a nitrogen atmosphere to form titanium disilicide (TiSi$_2$) where ever the titanium layer 48 contacts silicon. Titanium nitride is formed where the titanium layer 48 overlies oxide.

Figure 5:
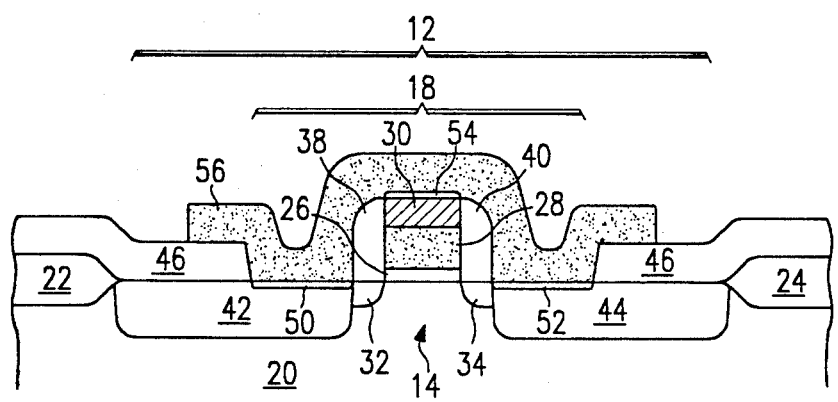

Referring to FIG. 5, the titanium nitride, and any remaining unreacted titanium is removed, leaving behind titanium disilicide regions 50, 52, and 54. Titanium disilicide regions 50, 52, overlying source/drain regions 42, 44, typically have a thickness of approximately 200 to 600 angstroms depending upon the thickness of the original titanium layer 48. Region 54, formed on the upper surface of tantalum dioxide layer 30, is generally much thinner because of the relatively lesser amounts of silicon available for reaction. An etchant suitable for removing titanium nitride and unreacted titanium selectively over titanium disilicide is known to those skilled in the art as piranha, which is a mixture of H$_2$O$_2$ and H$_2$SO$_4$.

A layer of polycrystalline silicon 56 is then deposited over the surface of the integrated circuit using CVD or LPCVD. This layer 56 is preferably deposited at a temperature of approximately 600°-650° C. with a fast push-in rate. At this temperature, titanium silicide formation between incompletely reacted TiSi and polysilicon will occur at the interface, so that any native oxide bonding which has occurred on the silicide regions 50, 52, 54 will be broken. Typically, a silicon reach phenomenon occurs due to the excess silicon represented by the polycrystalline silicon layer 56. This reaction of the titanium with the silicon in the source/drain regions 42, 44 and the polycrystalline silicon layer 56 ensures that a good electrical connection is made. For the same reasons, a good electrical contact is formed between the polycrystalline silicon layer 54 and the silicided layer 30.

Once the polycrystalline silicon layer 56 has been deposited, it is patterned to form the second level poly lead 16, resulting in the structures shown in FIG. 5. From this point, processing continues according to the usual process flow. The second level polycrystalline silicon layer 56 can be silicided if desired, followed by deposition of an insulating layer and further interconnect formation and metalization steps.

Figure 6:
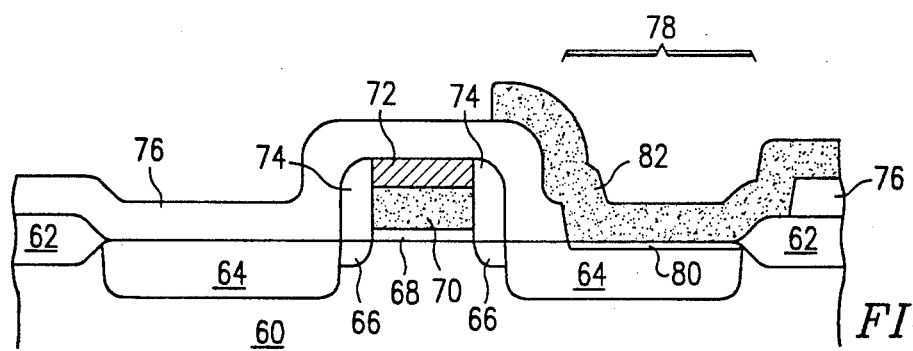
FIG. 6 is an alternative structure fabricated according to the present invention.

FIG. 6 shows use of the method described above in connection with a buried contact to a source/drain region of a field effect transistor. A substrate 60 has field oxide regions 62 for device isolation. Source/drain regions 64 and LDD regions 66 are formed in the substrate 60 as described above.

A gate includes a gate oxide layer 68, a gate polycrystalline silicon layer 70, and a silicided layer 72. Sidewall spacers 74 are formed on the sides of the gate. An interlevel oxide 76 is used to isolate the first level polycrystalline silicon layer from later interconnect levels.

A contact opening 78 is formed in the interlevel oxide layer 76, and a TiSi$_2$ region 80 formed within the source/drain region 64 as described above. A second level of polycrystalline silicon interconnect 82 is formed and patterned as described above. This forms the second level poly interconnect, and makes good electrical contact with the source/drain region 64 in the substrate 60 for the reasons described above.

Figure 7:
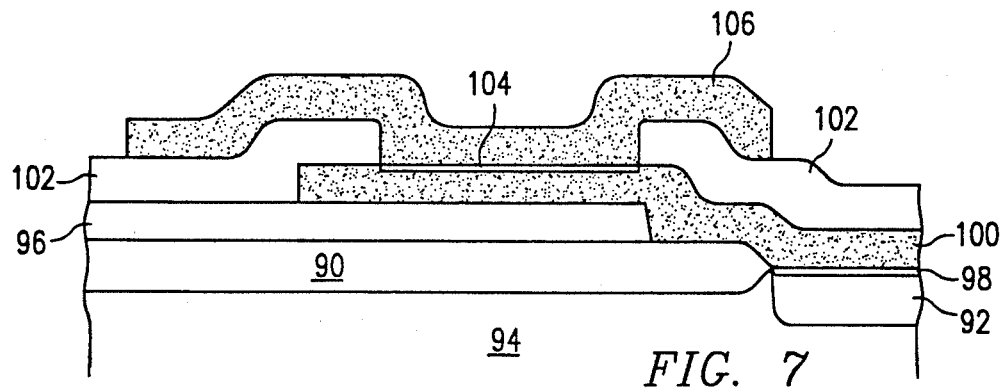
FIG. 7 is a second alternative structure fabricated according to the present invention.

Referring to FIG. 7, a contact between second level poly and third level poly interconnects is shown. A field oxide region 90 and active source/drain region 92 are formed within a substrate 94. A first interlevel oxide layer 96 overrides the field oxide layer 90 and other portions of the integrated circuit (not shown).

After contact openings are cut in the first interlevel oxide 96, a titanium disilicide region 98 is formed as described above, followed by deposition and patterning of a first level poly layer 100. A second interlevel oxide layer 102 is formed over the integrated circuit, and a contact opening cut therein. A second silicide region 104 is formed as described above followed by depositioning and patterning of a third level polycrystalline silicon layer 106. Formation of additional insulating layers, followed by metalization and passivation, follow in the usual manner.

The method described above for forming silicide regions for silicon to silicon contacts provides greatly improved electrical connections. The described process is self-aligned, in that no mask steps are required to form the silicide regions on the lower layer substrate or polycrystalline silicon. The described process improves electrical contact to an underlying polycrystalline silicon layer whether or not it has been previously silicided for conductivity enhancement.

While the invention has been particularly shown and described with reference to a preferred embodiment, it will be understood by those skilled in the art that various changes in form and detail may be made therein without departing from the spirit and scope of the invention.

What is claimed is:

1. A semiconductor integrated circuit structure, comprising:
   a gate oxide layer over a silicon substrate;
   a first polycrystalline silicon layer over the gate oxide layer;
   a first metal silicide layer over the first polycrystalline silicon layer;
   an insulating layer having an opening exposing portions of the substrate and the first metal silicide layer;
   a second metal silicide layer over the exposed substrate portion and over the exposed first metal silicide layer portion; and
   a second polycrystalline silicon layer extending into the opening and making contact with the second metal silicide layer, wherein the first polycrystalline silicon layer is electrically connected to the substrate to form a common node.

2. The structure of claim 1, further comprising insulating sidewall spacers alongside the vertical sides of the gate oxide, first polycrystalline silicon layer, and first metal silicide layer.

3. The structure of claim 2, wherein said insulating sidewall spacers comprise oxide.

4. The structure of claim 1, wherein the first metal silicide layer is a different metal silicide than the second metal silicide layer.

5. The structure of claim 4, wherein the first metal silicide layer comprises tantalum disilicide, and the second metal silicide layer comprises titanium disilicide.

6. The structure of claim 1, wherein the second polycrystalline silicon layer extends beyond the opening to cover portions of the insulating layer.

7. The structure of claim 1, wherein said insulating layer comprises oxide.

* * * * *